(12) United States Patent
Paschkewitz et al.

(10) Patent No.: US 8,695,687 B2
(45) Date of Patent: Apr. 15, 2014

(54) HYBRID PIN-FIN MICRO HEAT PIPE HEAT SINK AND METHOD OF FABRICATION

(75) Inventors: John S. Paschkewitz, San Carlos, CA (US); Eric Shrader, Belmont, CA (US); David Mathew Johnson, San Francisco, CA (US); John Stuart Fitch, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 558 days.

(21) Appl. No.: 12/965,616

(22) Filed: Dec. 10, 2010

(65) Prior Publication Data
US 2012/0145356 A1    Jun. 14, 2012

(51) Int. Cl.
*F28D 15/00* (2006.01)
*H01L 23/427* (2006.01)

(52) U.S. Cl.
USPC ............. 165/104.33; 165/104.21; 165/146; 165/80.3

(58) Field of Classification Search
USPC .............. 165/104.33, 104.21, 146, 80.3
See application file for complete search history.

(56) References Cited

U.S. PATENT DOCUMENTS

| | | | |
|---|---|---|---|
| 4,018,269 A | 4/1977 | Honda et al. | |
| 5,299,090 A | 3/1994 | Brady et al. | |
| 5,351,748 A | 10/1994 | Dagan | |
| 5,960,866 A * | 10/1999 | Kimura et al. | 165/104.33 |
| 5,988,266 A | 11/1999 | Smith et al. | |
| 6,000,132 A | 12/1999 | Butler | |
| 6,173,758 B1 | 1/2001 | Ward et al. | |
| 6,591,897 B1 | 7/2003 | Bhatti et al. | |
| 2006/0289146 A1 * | 12/2006 | Wu | 165/104.21 |
| 2007/0130769 A1 * | 6/2007 | Moon et al. | 29/890.032 |
| 2007/0215327 A1 * | 9/2007 | Lai et al. | 165/104.33 |
| 2007/0240856 A1 * | 10/2007 | Liu et al. | 165/104.26 |
| 2008/0105406 A1 * | 5/2008 | Chang et al. | 165/104.26 |
| 2008/0117637 A1 | 5/2008 | Chang et al. | |
| 2009/0025784 A1 | 1/2009 | Chan et al. | |
| 2010/0258287 A1 * | 10/2010 | Chen et al. | 165/185 |
| 2010/0263835 A1 * | 10/2010 | Wang | 165/104.26 |

FOREIGN PATENT DOCUMENTS

| | | | |
|---|---|---|---|
| JP | 2003014397 A | * | 1/2003 |
| WO | 2006/070955 A1 | | 6/2006 |

OTHER PUBLICATIONS

B. Suman, "On the Fill Charge and the Sensitivity Analysis of a V-Shaped Micro Heat Pipe", AIChE J., vol. 52, No. 9, pp. 3041-3054 (2006).

(Continued)

*Primary Examiner* — Brandon M Rosati
(74) *Attorney, Agent, or Firm* — Jonathan A. Small (57) ABSTRACT

A hybrid pin-fin micro heat pipe heat sink consists of a plurality of heat pipes secured to a base. The heat pipes have a generally hollow cross-section which transitions from a first cross-sectional shape (e.g., circular) to a second cross-sectional shape (e.g., triangular). A heat transfer medium (e.g., saturated steam) is sealed within the heat pipes. Cooling plates may be disposed over the base with the heat pipes in physical contact with and passing through the cooling plates. The method of manufacturing the heat pipes consists of passing a heat transfer medium through a pipe section having a first cross-sectional shape while transitioning to a second cross-sectional shape (e.g., by way of a rolling die press), then crimping the ends closed to seal the heat transfer medium therein.

12 Claims, 6 Drawing Sheets

(56) References Cited

OTHER PUBLICATIONS

C. Sobhan et al., "A review and comparative study of the investigations on micro heat pipes", Int. J. of Energy Res., vol. 31, pp. 664-688 (2007).

Groll, Manfred et al., "Keynote Paper—State of the Art on Pulsating Heat Pipes", Proceedings of ICMM2004, The 2nd International Conference on Microchannels and Minichannels, pp. 1-12, Jun. 17-19, 2004, Rochester, New York.

* cited by examiner

HYBRID PIN-FIN MICRO HEAT PIPE HEAT SINK AND METHOD OF FABRICATION

BACKGROUND

The present disclosure is related to heat sinks for cooling high power density electronic devices such as laser diodes, central processing units, etc., and more particularly to a heat sink design, elements thereof, and methods of making same.

A heat sink is a structural body with an extended surface area to facilitate heat dissipation into the environment for cooling. Heat sinks are commonly applied to a wide variety of heat-generating electronic devices to assist in maintaining a reduced operating temperature, often in conjunction with a fluid circulation system such as an air fan.

A typical heat sink has a planar surface which attaches to a device to be cooled, and a plurality of fins, pins, pipes or the like extending outward from said planar surface which form the extended surface area. Flat plate fin heat sinks are typically stamped, cast, extruded or machined monolithic structures. While relatively simple to produce, such devices are of only passable heat transfer efficiency, especially in use with high heat generating devices such as modern computer central processing units (CPUs), solid state light emitting devices (such as LEDs, solid-state lasers), etc.

Pin-fin heat sinks offer improved thermal performance as compared to flat plate fins, especially in forced convection cooling. In such designs, solid cylindrical pins are affixed to a substrate, such as by threading or soldering. Existing pin-fin heat sinks have thermal resistances on the order of 2-10 C/W (degrees C. per watt) in a fluid flow at a rate on the order of 400 LFPM (linear feet per minute) around the pin-fins. While an improvement on flat-fin heat sinks, this thermal resistance means that pin-fin heat sinks still do not reach the desired level of cooling preferred for many modern device applications.

While flat fins and pin-fins are commonly solid structures, heat pipes are typically hollow core structures, filled with air or other heat transfer medium. Heat pipes offer superior thermal resistance, as the effective conductivity is many multiples better than solid core structures such as copper. Manufacturing of heat pipes is generally an involved process, and hence more expensive than simple fins or pin-fins.

In one example of a heat pipe structure shown and described in U.S. Pat. No. 4,018,269, which is incorporated by reference herein, a heat pipe comprises concentric tubes with an inner tube covered with a metal fiber and spiral wound wire wick. In manufacture, a spool of tubing is passed through a straightener. Metal fibers are pressed onto the tube. The tube is then wound spirally with wire to produce a wicking structure. This wicking structure is then fired and wrapped with a metal sheet that is welded along a seam to create the outer tube. This blank can be cut to length, filled, and capped in separate processes. The completed filled heat pipes can be secured to a base, or otherwise attached to a device to be cooled, to produce a completed heat sink.

A current state-of-the-art heat pipe based CPU heat sink may have a thermal resistance of approximately 0.1-0.2 C/W at a flow rate of 400 LFPM, much improved over both flat-fin and pin-fin heat sinks. However, the above-described heat pipes, and the processes for making them, are relatively much more complex than simply producing either a flat-finned or pin-fin heat sink, and consequently comparatively much more expensive. The heat sink market typically must contend with low margins and high price sensitivity. Therefore, existing heat sink devices and methods of producing same either provide inadequate performance, are too large, are of overly complex design and manufacturing process, are of high unit cost, or several or all of the above.

SUMMARY

Accordingly, the present disclosure is directed to an improved heat pipe-based heat sink and method of making same. The heat pipe comprising a portion of the heat sink has a generally hollow cross-section. The heat pipe has a varying cross-section from proximal to distal ends. A core liquid or heat transfer medium is disposed and sealed within the heat pipe section. Heat pipe sections may be secured to a heat sink base by any of a plurality of methods such as brazing, welding, press-fitting, soldering, threading, gluing, etc. to form a completed heat sink.

In one embodiment, the heat pipe has a roughly triangular cross section at a proximal end which transitions to a roughly circular cross-section at a distal end. A wick effect is thereby produced without the complexity and cost of mesh and wire coil.

Sections of heat pipe can be used in similar arrangements as known pin-fin heat sinks on a heat sink base. The small cross-section of the heat pipes is on the order of known pins used in pin-fin heat sinks. Therefore, the heat sink of the present disclosure is referred to as a hybrid pin-fin heat pipe heat sink. Furthermore, due to the relatively much smaller size of the heat pipes disclosed herein as compared to known heat pipe designs, the structures disclosed herein are referred to as hybrid pin-fin micro heat pipes.

In one embodiment, the heat pipe is filled with an "optimal" amount of saturated steam. Heat pipes are basically closed loop phase change devices. They are filled with a liquid that boils and evaporates at a "hot" end and condenses at a "cold" end of the pipe. To close the loop, in place of a wick, the corners of a micro-heat pipe are used to return condensed liquid back to the hot end of the pipe.

The choice of fluid for a heat pipe depends on the temperature range in which the heat pipe is expected to operate. For electronics cooling applications, water may be a sufficient fluid, as it boils and condenses at temperatures experienced in typical electronic device applications (such as computer CPU cooling). The use of saturated steam implies that the steam and water are in thermodynamic equilibrium at the temperature and pressure at which the two are "loaded" into the pipe. As soon as the temperature is dropped, the steam will condense into water. For a discussion of micro-heat pipe specific implementations, see Lee et al., PCT published application WO 20061070955A1, which is incorporated herein by reference.

Steps are taken such that the heat pipe is filled with only the working liquid that changes phase. Introduction of residual air or other "non-condensing" vapor or minimized or eliminated as they do not contribute to the heat transfer process.

Steps are taken such that the heat pipe is filled with an "optimal" amount of liquid. If filled with too much liquid, the cold (condenser) end will flood and heat transfer will be reduced as heat will have to conduct through a liquid layer. This slows the time required for the heat pipe to come to a steady state condition at which the heat transfer is maximized and reduces the overall effectiveness. If filled with too little liquid, the evaporator will dry out and the heat pipe will fail to operate effectively at higher heat inputs. For a discussion of an "optimal" fill amount, see B. Suman, "On the Fill Charge and the Sensitivity Analysis of a V-Shaped Micro Heat Pipe", AIChE J., vol. 52, no. 9, pp. 3041-3054 (2006), incorporated herein by reference.

A hybrid pin-fin heat pipe heat sink according to the present disclosure offers improved performance for a given size of heat sink size, requires a reduced throughput of cooling fluid to achieve a particular level of cooling, and improved maximum heat load/flux compared to a state of the art heat pipe-based heat sink. In addition, the process disclosed herein for manufacturing a hybrid pin-fin heat pipe heat sink is simple and low-cost, enabling the cost of a hybrid pin-fin heat pipe heat sink to approach that of conventional flat-fin or pin-fin designs.

Accordingly, a hybrid pin-fin heat pipe heat sink comprises a plurality of heat pipes, each heat pipe comprising a substantially hollow structure having a proximal end and a distal end, and having a first cross-sectional shape at the proximal end and a second cross-sectional shape at the distal end. The first and said second cross-sectional shapes are different. The proximal and distal ends of each structure are sealed shut so as to seal a heat transfer medium therein. The heat transfer medium may, for example, be saturated steam or other heat absorbing fluid. The heat pipes are secured to a heat conductive base, for example such as brazing, welding, press-fitting, soldering, threading, gluing, etc. The method of manufacturing the heat pipe for this heat sink comprises introducing saturated steam into a cylindrical pipe section having a generally uniform cross section comprising a first cross-sectional shape, transitioning the cross-section of said cylindrical pipe section from the first cross-sectional shape to a second cross-sectional shape different than the first cross-sectional shape such that at a distal end said cylindrical pipe section retains the first cross-sectional shape and transitions to the second cross-sectional shape at a proximal end, and sealing both the proximal and distal ends to thereby seal the saturated steam therein and thereby form a heat pipe structure.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details are merely summarized or are omitted so as not to unnecessarily obscure the details of the present invention. Thus, where details are otherwise well known, we leave it to the application of the present invention to suggest or dictate choices relating to those details.

Figure 1:
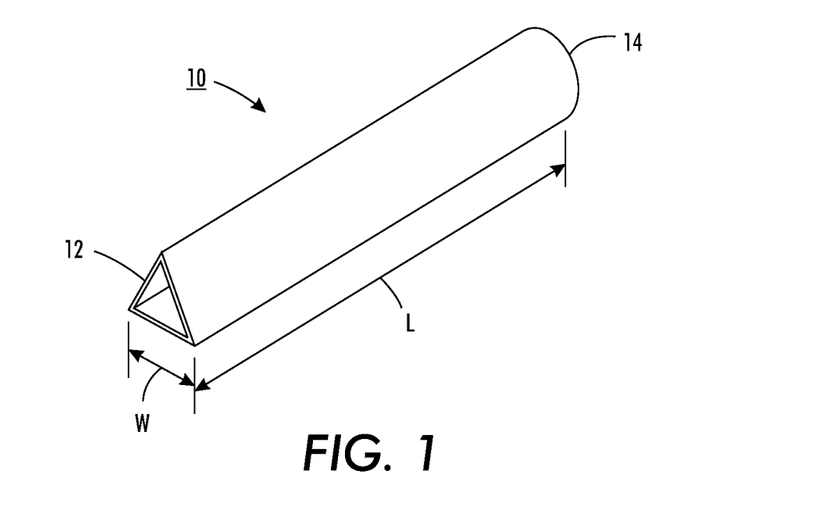
FIG. 1 is a perspective view of a heat pipe for use in a hybrid pin-fin micro heat pipe heat sink according to the present disclosure.

With reference first to FIG. 1, a perspective view of a heat pipe 10 according to the present disclosure is shown. In one example, the length L of heat pipe 10 is on the order of 20 millimeters (mm), but may be longer or shorter depending on the desired cooling efficiency, intended application and so forth. The width W of heat pipe 10 may be on the order of 120 micrometers ($\mu$m), but similarly may be longer or shorter depending on the desired cooling efficiency, intended application and so forth.

Figure 2:
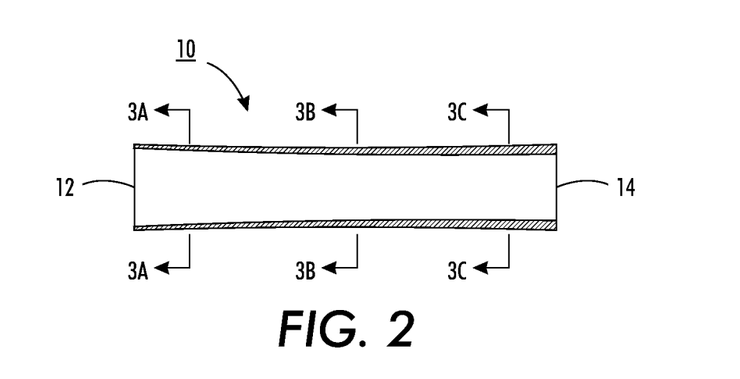
FIG. 2 is a cross-section view perpendicular to the long axis of the heat pipe for use in a hybrid pin-fin micro heat pipe heat sink shown in FIG. 1.
Figure 3A:
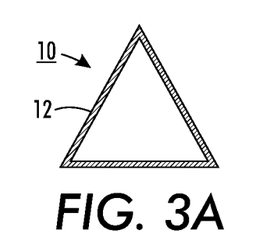
FIGS. 3A through 3C are cross-sectional views of the heat pipe for use in a hybrid pin-fin micro heat pipe heat sink shown in FIGS. 1 and 2 at various positions along its length.
Figure 3B:
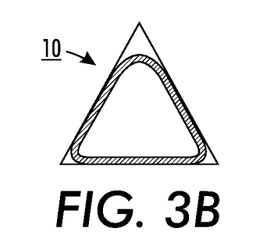
Figure 3C:
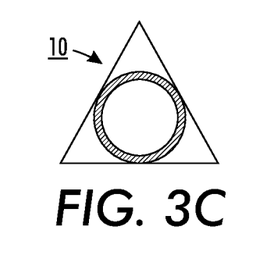

Referring to FIG. 2, heat pipe 10 is shown therein in cross-section. Heat pipe 10 has a varying cross-section proceeding from proximal end 12 to distal end 14. At proximal end 12, heat pipe 10 has a first cross-section, for example substantially triangular. (While shown in FIGS. 1 and 2 as being open, it will be appreciated that in use proximal end 12 will typically be crimped closed to secure a heat transfer medium therein). Proceeding in a direction toward distal end 14, the cross-section transitions, for example to a substantially circular or similar cross-section. This transition is illustrated in further detail in FIGS. 3A through 3C, which are cross-section views of heat pipe 10 at various positions along its length. As can be seen in FIGS. 2 and 3A-3C, the region from the proximal end until 3A, also known as a first distance, as shown in FIG. 2, has a substantially triangular cross-sectional shape. The transitioning begins at 3A, as shown in FIG. 2, transitions between 3A-3C, and ends at 3C, as shown in FIG. 2.

The region from 3C, until the distal end, as shown in FIG. 2, also known as a second distance, has a substantially circular cross-sectional shape. As discussed further below, many different tubing cross-sections and transitions are contemplated hereby. As a general principle, at one end of heat pipe 10, the cross-section should facilitate convenient attachment to a heat sink base. And, the cross-section should vary such that angular interior walls are provided and form interior corners in order to provide a wicking function for a heat transfer fluid sealed with the heat pipe and discussed further below.

Figure 4:
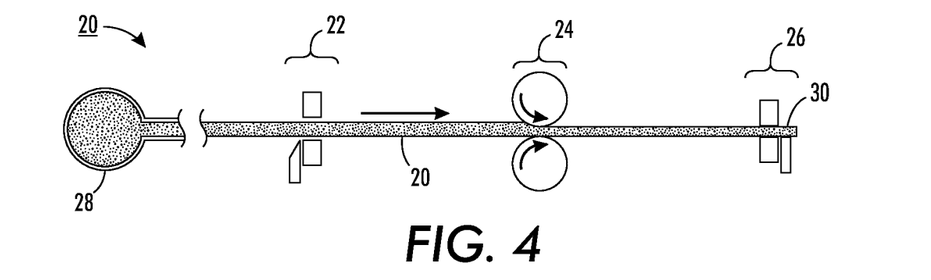
FIG. 4 is a schematic illustration of a system for producing heat pipes for use in a hybrid pin-fin micro heat pipe heat sink according to the present disclosure, at a first stage of producing a heat pipe.

With regard next to FIG. 4, a system 20 for production of heat pipes of the type described above is illustrated. Initially, a tubing source such as a roll (not shown) supplies a tubing section 20 with a roughly circular cross-section. The initial diameter of the tubing section can be on the order of several millimeters (mm) to several centimeters (cm). Rollers or other known mechanism not shown ensures that tubing section 20 is relatively linear. Tubing section 20 extends past a cutter/crimper assembly 22, past a rolling die press assembly 24, and extends to a crimping assembly 26. While each of cutter/crimper assembly 22, rolling die press assembly 24, and crimping assembly 26 are shown in schematic representation in FIG. 4, it will be appreciated that many other arrangements of elements may be employed to obtain the functionality described herein with regard to these assemblies.

Tubing section 20 is filled with a heat transfer medium, such as saturated steam. A saturated steam source 28 is disposed so as to purge and fill the interior of tubing section 20, if not the full coil of tubing, with saturated steam on a continuous basis. Once its ends are sealed, tube section 20 will contain the saturated steam, which assists with the transfer of heat energy away from a structure to which the heat sink is attached.

As tubing section 20 passes past rolling die press assembly 24 the diameter of the tubing section is significantly reduced thereby, for example to 50-500 microns (μm), and the cross section of tubing section 20 is reshaped by rolling die press assembly 24 from roughly circular to, for example, roughly triangular. The end 30 of tubing section 20 having the roughly triangular cross-section post rolling die press assembly 24 forms the proximal end of the heat pipe, and the end 32 of tubing section 20 disposed before rolling die press assembly 24 (i.e., of unmodified cross-section) forms the distal end of the heat pipe.

Figure 5:
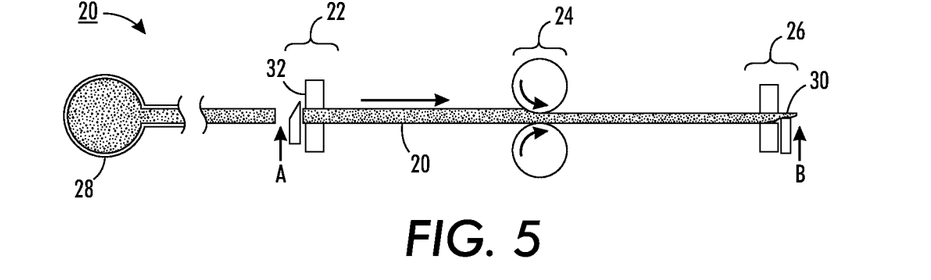
FIG. 5 is a schematic illustration of a system for producing heat pipes for use in a hybrid pin-fin micro heat pipe heat sink according to the present disclosure, at a second stage of producing a heat pipe subsequent to said first stage shown in FIG. 4.

With reference to FIG. 5, in order to seal saturated steam within tubing section 20, while saturated steam source 28 forces saturated steam through the interior of tubing section 20, cutter/crimper assembly 22 cuts tubing section 20 and crimps closed the end 32 at that cut with a motion such as along arrow A, while crimping assembly 26 crimps closed end 30, with a motion such as along arrow B. The significant reduction in the diameter of tubing section 20 by rolling die press assembly 24 between cutter/crimper assembly 22 and crimping assembly 26 assists in minimizing the pressure drop of the steam within tubing section 20, addressing problems identified for example in other known heat pipe efforts (see, e.g., the aforementioned WO 2006/070955A1). Tubing section 20 may be ejected from the mechanism and another portion introduced and the process repeated, or the tubing section may continue through the rolling die press 24, with the rolling die press applying a gradually reduced pressure to so that the cross-section of tubing section 20 gradually transitions from round to triangular (or from some other first shape, such as oval, to a different second shape, such as rectangular).

Figure 11:
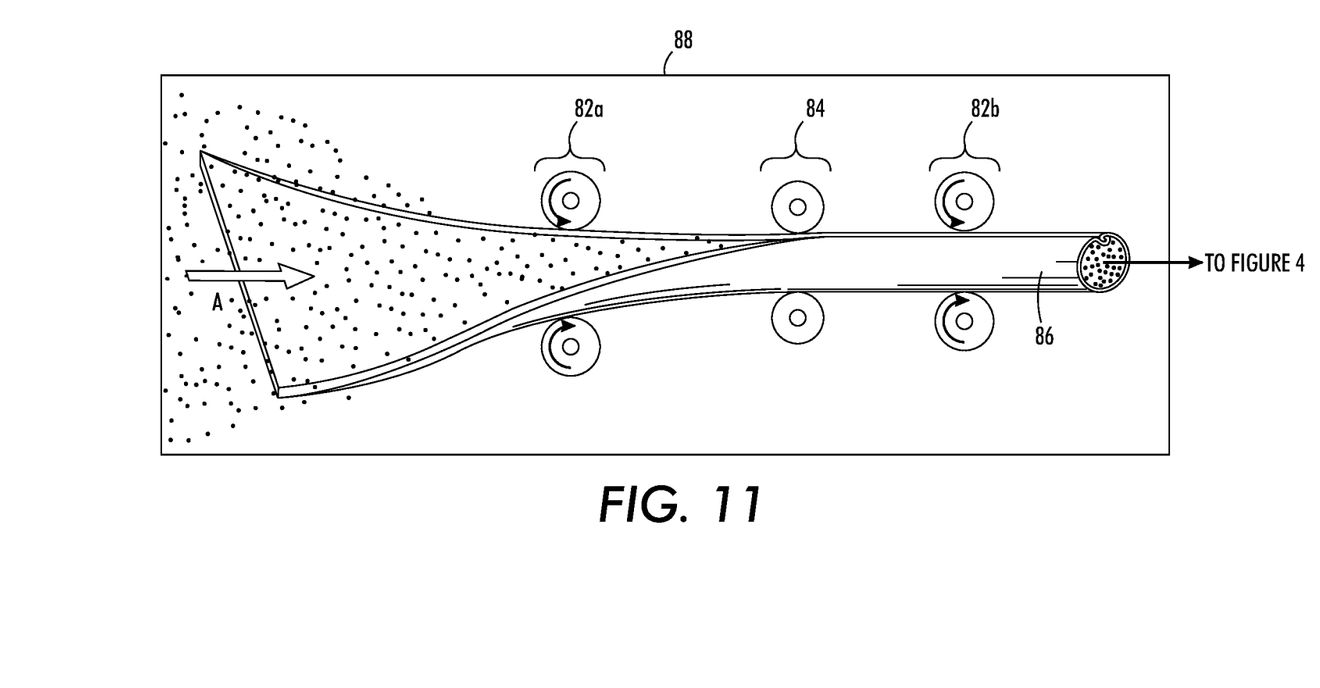
FIG. 11 is a schematic illustration of an alternate system for producing heat pipes for use in a hybrid pin-fin micro heat pipe heat sink according to the present disclosure.

According to another embodiment of the present disclosure, a micro heat pipe may be manufactured as shown in FIG. 11. Initially, a flat sheet material 80, such as sheet copper, aluminum, or other metal or metal alloy, passes through various shaping and extruding stations 82a, 82b (shown schematically in FIG. 11, but whose more specific details will be understood by one skilled in the art), and a seaming station 84 (again, shown schematically but whose more specific details will be understood by one skilled in the art) to produce a pipe-shaped region 86. As the process proceeds, the pipe-shaped region 86 is reduced in diameter. While the final diameter will depend on many variables, in one embodiment the final diameter of pipe-shaped section 86 may be on the order of 50-500 μm. Saturated steam is introduced at and flows in the direction of arrow A. The steam fills the pipe section as it is being formed, exiting along the seam edge prior to the seam being sealed at seaming station 84. In order to fill pipe-shaped region 86 with steam with minimal pressure drop, the process of shaping and seaming the pipe-shaped section is performed within an enclosed steam chamber 88. Pipe-shaped section is then sealed at its ends, for example by apparatus and processes similar to that described with regard to FIGS. 4 and 5.

In operation, a first longitudinal end of the heat pipe is placed proximate a heat source that is to be cooled (heat energy is to be removed). Liquid within the heat pipe at this point boils and evaporates. It is drawn to a second longitudinal end of the heat pipe opposite the first end. Due to the second end being spaced apart from the heat source, the second end is cooler than the first end. This cooler end acts as a condenser. Heat energy is removed at this end and dissipated into the environment as the steam condenses back into a liquid phase. To close the loop, the corners of the heat pipe act as a channel (taking the pace of a conventional wick) to return condensed liquid back to the first, hot end of the pipe.

Use of different heat pipe cross-sections provide differences in efficiency. See, e.g., C. Sobhan et al., "A review and comparative study of the investigations on micro heat pipes", Int. J. of Energy Res., vol. 31, pp. 664-688 (2007), which is incorporated herein by reference. Indeed, variable heat pipe cross-section may be used. Several advantages may be provided, such as a larger evaporator area compared to the condenser area, which may help prevent dryout, and by changing the angle of the corner, the number or corners, or the size of the wetted fluid region relative to the corners the fluid flow within the heat pipe can be selectively modified.

It is also possible to create filled pin fins using conventional heat pipe technology using the process described. In this case a wicking structure needs to be incorporated into the tubing. The conventional pin structure is filled as described above from a saturated steam source, and the pipe sections crimped and closed to retain the saturated steam, as described above.

Figure 6:
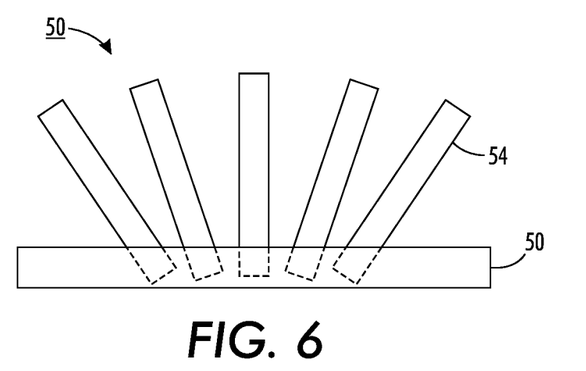
FIG. 6 is a side view of a hybrid pin-fin micro heat pipe heat sink according to one embodiment of the present disclosure, with hybrid pin-fin heat pipes arranged in a semi-spherical bloom pattern, with the long axes of each pin out of parallel with one another.

A completed hybrid pin-fin micro heat pipe heat sink 50 according to one embodiment of the present disclosure is shown in FIG. 6. Heat sink 50 comprises a base structure 50 and an array of heat pipes 54 secured to base structure 52. Base structure 52 comprises a thermally conductive material, such as aluminum, aluminum alloy, or similar metal or like material. Heat pipes 52 may be substantially as disclosed in one of the embodiments described above, with a distal end thereof, for example of circular cross-section disposed within corresponding recesses, such as drilled holes, formed in base structure 52. Heat pipes 54 may be secured to base structure 52 by any of a plurality of methods such as brazing, welding, press-fitting, soldering, threading, gluing, etc. Heat pipes 52 may be arrayed in a non-linear pattern (i.e., the long axes of heat pipes 52 are not parallel to one another, and are generally not perpendicular to the plane of base structure 52), as shown in FIG. 6, or some other pattern such as with most or all of the long axes of heat pipes 52 perpendicular to the plane of base structure 52.

Figure 7:
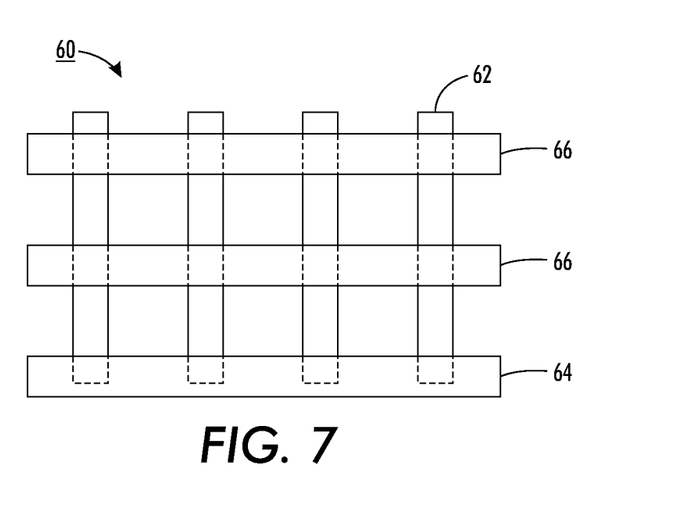
FIG. 7 is a side view of a hybrid pin-fin micro heat pipe heat sink according to another embodiment of the present disclosure, with hybrid pin-fin heat pipes arranged in a grid pattern and passing through cooling plates disposed over and roughly parallel to a base.

According to an alternative embodiment 60 of the present disclosure, heat pipes 62, which may be substantially as disclosed in one of the embodiments described above, are mounted to substrate 64 by any of a plurality of methods such as brazing, welding, press-fitting, soldering, threading, gluing, etc., and through a plurality of stacked, spaced-apart cooling plates 66, formed for example from thin sheet metal, as illustrated in FIG. 7, that act as cooling fins in a manner similar to known heat pipe-based heat sinks. While two such plates 66 are shown, from one to many such plates may be employed as will be readily understood from this description.

The thermal resistance of a heat sink can be decomposed into a base conduction resistance and "fin resistance". The fin resistance is characterized by a "fin efficiency", which compares the actual fin performance to that of an ideal, infinite thermal conductivity fin, which is isothermal and equal to the temperature at the base of the fin. The heat pipe pin-fins disclosed herein approximate this ideal infinite conductivity fin when compared to a standard solid, flat plate fin, since we have found that the effective conductivity of the heat pipes disclosed herein may be roughly three orders of magnitude or more greater than such solid fins (for example, when formed of copper). The same may be said with regard to standard pin-fins, with the heat pipes still providing a significant improvement thereover.

Fin resistance is also a function of the fin-to-fluid heat transfer resistance. For low fluid flow situations, this resistance is large and a fin is relatively ineffective at sinking heat to the fluid (e.g., air). However, a heat sink of the type disclosed herein is particularly effective in applications such as relatively low fin-fluid resistance, or medium-high flow rate forced convection, where typical fin efficiency is relatively low for conventional materials. For example, assuming a convective heat transfer coefficient of 1000 $W/m^2K$ (watts per square meter per degree K), with the fin comprising a pin with a radius of 500 µm, and pin length of 5 cm, and composed of a 6061 aluminum alloy, the fin efficiency is 13%, while a similarly sized heat pipe of a type disclosed herein has an effective fin efficiency of roughly 30%. Thus, assuming that the thermal resistance of the heat sink is dominated by the fin resistance, use of the heat pipe reduces heat sink thermal resistance by roughly one-half as compared to a 6061 aluminum alloy pin.

A number of examples of a hybrid pin-fin micro heat pipe heat sink and methods of making same have been disclosed herein. No limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Figure 8:
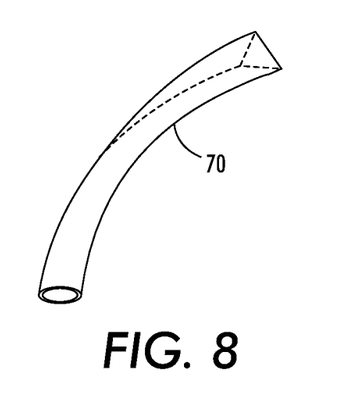
FIG. 8 is a side view of a heat pipe having a smoothly varying continuous arc-shape along its long axis according to an embodiment of the present disclosure.
Figure 9:
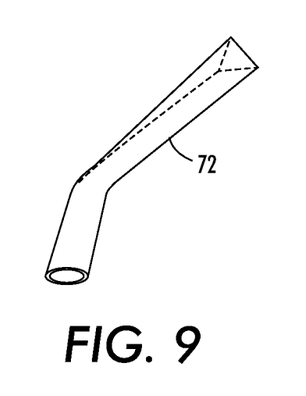
FIG. 9 is a side view of a heat pipe formed of two linear subsections such that the long axes thereof are non-parallel to one another according to another embodiment of the present disclosure.
Figure 10:
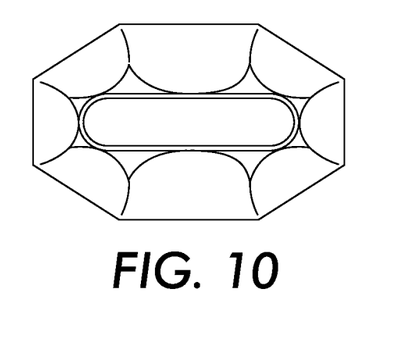
FIG. 10 is an axial end view of an alternative embodiment of a heat pipe according to an embodiment of the present disclosure, in which the cross-section of the heat pipe transitions from other than round (in this case, oval) to other than triangular (in this case, octagonal).

Furthermore, while a plurality of exemplary embodiments have been presented in the foregoing detailed description, it should be understood that a vast number of variations exist, and these exemplary embodiments are merely representative examples, and are not intended to limit the scope, applicability or configuration of the disclosure in any way. For example, while shown as essentially linear pipe sections, the heat pipes described above may be non linear sections, such as smoothly varying continuous arcs as shown in FIG. 8, multiple linear subsections with non-parallel long axes (i.e., one element bent so as to have two non-coaxial subsections) as shown in FIG. 9, etc. Such non-linear shapes may be provided by the same apparatus and during the processes of forming the heat pipe sections described and shown in FIGS. 4 and 5, or by separate apparatus and processes, such as after cross-sectional shaping and sealing of the heat transfer medium in the heat pipe sections. Furthermore, the above description has focused on a heat pipe section which transitions from a triangular cross-section at a proximate end to a circular cross-section at the distal, opposite end. However, many different tubing cross-sections are contemplated hereby. Just one of these many different cross-sectional transitions, in this case from oval to octagonal, is shown in FIG. 10 in order to illustrate that the present disclosure is not limited to any particular cross-sectional shapes.

Furthermore, various of the above-disclosed and other features and functions, or alternative thereof, may be desirably combined into many other different systems for many different applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A heat sink heat pipe, comprising:
a substantially hollow structure, said structure having a proximal end and an opposite distal end, said structure having a first, substantially triangular cross-sectional shape at said proximal end transitioning to a second, substantially circular cross-sectional shape at said distal end, said transitioning beginning at a first location, located at a first distance from said proximal end and ending at a second location, located at a second distance from said distal end, wherein vertices of said substantially triangular cross-section gradually round along the length of said structure from said first location to said second location said structure having closed ends so as to seal a heat transfer medium therein.

2. The heat sink heat pipe of claim 1, wherein said heat transfer medium is saturated steam.

3. The heat sink heat pipe of claim 1, wherein said structure is a substantially linear tubing section.

4. The heat sink heat pipe of claim 1, wherein said structure follows a smoothly varying continuous arc-shape along its long axis.

5. The heat sink heat pipe of claim 1, wherein said structure is comprised exclusively of multiple linear subsections such that long axes of each said subsection are non-parallel to one another.

6. A heat sink, comprising:
a base structure;
a plurality of substantially hollow heat pipe structures, each said heat pipe structure comprising:
a proximal end and an opposite distal end, said structure having a first, substantially triangular cross-sectional shape at said proximal end transitioning to a second, substantially circular cross-sectional shape at said distal end, said transitioning beginning at a first location, located at a first distance from said proximal end and ending at a second location, located at a second distance from said distal end, wherein vertices of said substantially triangular cross-section gradually round along the length of said structure from said first location to said second location; and a closed proximal end and a closed distal end so as to seal a heat transfer medium therein;

said plurality of heat pipe structures secured at a distal end of each to said base structure.

7. The heat sink of claim 6, wherein said base structure comprises a thermally conductive metal.

8. The heat sink of claim 6, wherein said heat transfer medium is saturated steam.

9. The heat sink of claim 6, wherein said structure is a substantially linear tubing section.

10. The heat sink of claim 6, wherein said heat pipes are secured to said base structure such that long axes of such heat pipes are not parallel to one another.

11. The heat sink of claim 6, wherein said base structure is substantially planar, and said heat pipes are secured to said base structure such that long axes of each of said heat pipes are substantially perpendicular to the plane of said base structure.

12. The heat sink of claim 11, further comprising a planar cooling plate disposed such that the plane thereof is roughly parallel to the plane of said base structure, said cooling plate spaced apart form said base structure, said cooling plate having said heat pipes passing though openings therein.

* * * * *